(12) United States Patent
Hirota et al.

(10) Patent No.: US 6,342,714 B1
(45) Date of Patent: Jan. 29, 2002

(54) HSG LOWER ELECTRODE STRUCTURE HAVING A NECK SUPPORTED BY A SILICON LAYER

(75) Inventors: Toshiyuki Hirota; Ichiro Honma, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/249,016

(22) Filed: Feb. 12, 1999

(30) Foreign Application Priority Data

Feb. 16, 1998 (JP) .......................................... 10-032854

(51) Int. Cl.$^7$ ............................................. H01L 27/108
(52) U.S. Cl. ........................ 257/306; 257/309; 257/317; 257/398; 257/255; 257/665; 257/964
(58) Field of Search ................................ 257/309, 317, 257/306; 438/398, 255, 665, 964

(56) References Cited

U.S. PATENT DOCUMENTS

| | | | |
|---|---|---|---|
| 5,796,484 A | * 8/1998 | Honma et al. | 356/371 |
| 5,930,625 A | * 7/1999 | Lin et al. | 438/398 |
| 5,989,969 A | * 11/1999 | Watanabe et al. | 438/381 |
| 6,013,555 A | * 1/2000 | Yew et al. | 438/398 |
| 6,037,220 A | * 3/2000 | Chien et al. | 438/398 |
| 6,066,529 A | * 5/2000 | Lin et al. | 438/398 |

FOREIGN PATENT DOCUMENTS

| | | |
|---|---|---|
| JP | 51-146174 | 12/1976 |
| JP | 61-208829 | 9/1986 |
| JP | 6-275778 | 9/1994 |
| JP | 8-306646 | 11/1996 |

OTHER PUBLICATIONS

H. Watanabe et al., "Tsukuba", *Hemispherical Grained Silicon (HSG–Si) Formation on In–Situ Phosphorous Doped Amorphous–Si Using the Seeding Method*, pp. 422–424, (1992).

* cited by examiner

*Primary Examiner*—Fetsum Abraham
(74) *Attorney, Agent, or Firm*—Foley & Lardner

(57) ABSTRACT

A hemispherical grained (HSG) lower electrode, and its manufacturing method, are disclosed in which the yield is enhanced by suppressing the depletion due to insufficient diffusion of an impurity into the hemispherical grains (abbreviated also as HSGs) to reduce the deterioration in the capacity caused by the defect on the negative (lower) electrode side, and preventing the fracture of the HSGs. In a method of forming a capacitor composed of a polysilicon lower electrode, a dielectric film, and an upper electrode, the method of this invention includes at least a step of forming HSG silicon on the lower electrode, where each of its grains has a neck with decreased diameter on the side of the contact plane with the lower electrode, a step of depositing a silicon film covering the HSGs by filling the gaps between the lower electrode in the periphery of the necks and the HSGs while maintaining the rugged shape of the formed HSGs, a step of forming a dielectric film, and a step of forming an upper electrode.

19 Claims, 8 Drawing Sheets

US 6,342,714 B1

HSG LOWER ELECTRODE STRUCTURE HAVING A NECK SUPPORTED BY A SILICON LAYER

BACKGROUND OF THE INVENTION

1. Field of the Invention

The present invention relates to a semiconductor device, and more particularly to an HSG lower electrode structure employed in the capacitor part of a storage device such as a DRAM, SRAM and the like, and a capacitor having the lower electrode as well as a formation method of the capacitor.

2. Description of the Related Art

In recent years, hemispherical grained (HSG) silicon is being used as the lower electrode of the capacitor of a DRAM. The use of HSG silicon has an advantage of facilitating the expansion of the surface area of the electrode by a smaller number of manhours. Since, however, no impurity is included in HSG silicon immediately after its formation, it is necessary to introduce an impurity into it afterward in one way or another in order to make it function as an electrode.

Ion implantation was tried in the early stage of the development, but it soon became clear that an expected increase in the surface area cannot be attained due to collapse of the shape of the hemispherical grains (HSGs) as a result of sputtering accompanying the implantation of the ions.

Later on, a method of forming HSGs on impurity doped amorphous silicon was established, and a method of introducing an impurity into the body of the HSGs by thermal diffusion through the underlying layer of the HSGs has been employed.

In a paper entitled "Hemispherical Grained Silicon Formation on in-situ Phosphorus Doped Amorphous-Si Using the Seeding Method," Solid State Devices and Materials, 1992, p. 422, it was disclosed that grains controlled in size and density can be formed on phosphorus doped amorphous silicon. By subsequent diffusion of phosphorus into the grains by means of thermal diffusion, it becomes possible to make the grains function as an electrode.

However, the region of diffusion layer has to be made fine and the thermal history has to be reduced along with micro refining of the devices, and as a result, a satisfactory thermal diffusion of the impurity is now becoming difficult. As a result of the insufficient introduction of the impurity into HSG body, a problem is being surfaced that the capacitance of the capacitor is not increased as expected because of the depletion in the electrode. In particular, when the expansion of the surface area is attempted by forming the grain in spherical shape, the diameter of the grain on the side of the surface of its contact with the underlying layer is reduced, giving rise to the so-called "neck." Diffusion of the impurity through such a narrow "neck" is made the more difficult.

Besides, in an HSG having such a narrow "neck," the HSG is liable to be fractured in the process of cleaning or the like, and the fragments of the fracture cause short-circuit between the electrodes, leading to the reduction in the yield.

In the past, in order to prevent the occurrence of depletion and fracture of the HSG, the HSG was formed in a hemispherical shape having no constricted part, that is, in a manner where the effective surface area was sacrificed.

SUMMARY OF THE INVENTION

It is therefore an object of the present invention to provide a method of forming a capacitor which enables the prevention of the occurrence of depletion and fracture of the HSGs without resorting to the sacrifice, as was the case in the conventional method, of the effective surface area.

It is another object of the present invention to provide a structure of an HSG lower electrode and the constitution of a capacitor by means of the above-mentioned formation method.

The present invention for resolving the problems is, in a method of formation of a capacitor composed of a polysilicon lower electrode, a dielectric film, and an upper electrode, the method of formation of a capacitor comprising at least a step of forming on a silicon layer, HSG silicon bodies having necks of small diameter on the side of the contact surface with the silicon layer, a step of forming a lower electrode by depositing a silicon film keeping the ruggedness of the formed HSGs so as to cover the HSGs by filling the gaps between the silicon layer around the necks and the HSGs, a step of forming a dielectric film, and a step of forming an upper electrode.

Further, the present invention is a capacitor provided with an HSG lower electrode having a silicon layer and spherical silicon grains formed on the silicon layer, wherein the silicon grain has a neck with a small diameter (first diameter) on the side of contact surface with the silicon layer, and a silicon film formed so as to cover the silicon grain by filling the gap between the silicon layer around the periphery of the neck and the grain while retaining the rugged shape of the silicon grain, a lower electrode structure formed in such a way that the diameter (second diameter) of the neck covered with the silicon film is smaller than the maximum diameter of the silicon grain formed by being covered with the silicon film, a dielectric film formed on the lower electrode, and a conductive film formed on the dielectric film.

BRIEF DESCRIPTION OF THE DRAWINGS

The above-mentioned and other objects, features, and advantages of this invention will become more apparent by reference to the following detailed description of the invention taken in conjunction with the accompanying drawings, in which.

DESCRIPTION OF THE PREFERRED EMBODIMENTS

Figure 1:
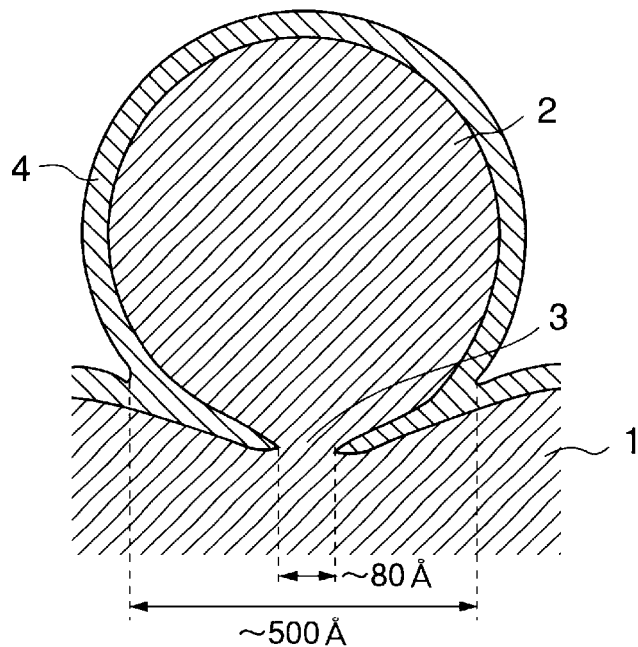
FIG. 1 is an enlarged sectional view of the HSG portion according to an embodiment of the invention.

The present invention comprises at least a step of forming HSG silicon with the above shape on the lower electrode, a step of depositing an undoped or an impurity doped silicon film so as to cover the formed HSGs while reflecting their ruggedness, a step of forming a dielectric film, and a step of forming an upper electrode.

In other words, by depositing a silicon film on the surface of the formed HSGs, the "necks" of the HSGs, which serve as the diffusion paths of the impurity from the lower electrode in the subsequent thermal diffusion process, are augmented to facilitate the diffusion of the impurity into the body of the HSGs.

In this invention, the deposition of a silicon film on the HSGs inevitably bring about a reduction in the surface area compared with the case of HSGs having no silicon film. With this in mind, it is possible to partially recover the surface area reduction brought about by the formation of the silicon film without spoiling the effect of the present invention, by introducing a process in which the deposited silicon film is etched isotropically leaving a part of the silicon film.

Moreover, in this invention, by depositing an impurity doped silicon film on the surface of the formed HSGs, it is possible to augment the "necks" of the HSGs which serve as the diffusion passages of the impurity, as well as to make the impurity doped silicon film itself serve as the supply source of the impurity to the HSGs.

In this case, it is preferable that an undoped silicon film or an impurity doped silicon film covering the HSGs is deposited in the same reaction furnace after the process of selectively forming the HSG silicon on the lower electrode, without exposing the HSGs to the atmosphere to avoid oxidation of the HSG silicon.

A method of forming HSG silicon is disclosed in detail, for example, in Publication of Unexamined Patent Applications, No. Hei 8-306646 filed by the present inventors. According to the invention, first, an undoped amorphous silicon film containing fine silicon crystals is formed on a lower electrode in a pattern of desired shape by the so-called LP-CVD in which the electrode is irradiated with a gasifiable silicon containing compound such as silane ($SiH4$) or disilane ($Si2H6$) in gaseous state, diluted by an inert gas if desired, under reduced pressure of, for example, 1 mTorr at a temperature of 550 to 570° C. or so. When an amorphous silicon film with desired thickness is formed, irradiation with silane or disilane is stopped and HSG growth is induced by annealing the sample under a high vacuum or in an atmosphere of an inert gas. By subjecting the sample to annealing HSG growth takes place by the migration of silicon atoms in the surroundings of the fine silicon crystals that act as the nuclei.

The undoped amorphous silicon film may be formed also by molecular beam epitaxy (MBE) in addition to the LP-CVD.

The annealing conditions may be such that the temperature and duration of annealing are adjusted to obtain desired size of the HSGs, for example, in the temperature range of 550 to 600° C. and duration of about 2 to 60 minutes. The duration of annealing depends upon the annealing temperature, the impurity concentration of the impurity in amorphous silicon, and the target HSG size.

In the present invention, the lower electrode is formed of an impurity doped amorphous silicon. There is no special limitations on the dose of the impurity provided that desired electrode characteristics are obtainable, but it is preferable that it is in the range of $1.0 \times 10^{20}$ to $5.0 \times 10^{20}$ atoms/cc. The doping of the impurity may be carried out either by mixing a raw material which can introduce the desired impurity simultaneous with the formation of the amorphous silicon film, or by implantation of the impurity ions after the formation of the undoped amorphous silicon film.

In this invention, the impurity may be any element so long as it is capable of imparting conductivity to silicon, but an n-type impurity such as phosphorus (P), arsenic (As), antimony (Sb), or bismuth (Bi) is preferable, and phosphorus is especially preferable.

The shape of HSG silicon formed in this invention is either one of spherical, hemispherical, or one that may be described as mushroom shape. It has the so-called "neck" structure in which its diameter on the side of contact surface with the underlying lower electrode is smaller than its maximum diameter in a plane perpendicular to the direction of growth, forming a constriction. Depending upon the growth conditions of the HSGs, the HSGs may form a shape different from spherical due to mutual contact of the neighboring grains, but even in such a case, the cross-section has a shape in which the individual grains maintain narrowed necks on the side of contact plane with the lower electrode.

The maximum diameter of the HSGs is preferably in the range of 300 to 900 Å, and more preferably 500 to 700 Å.

Figure 9:
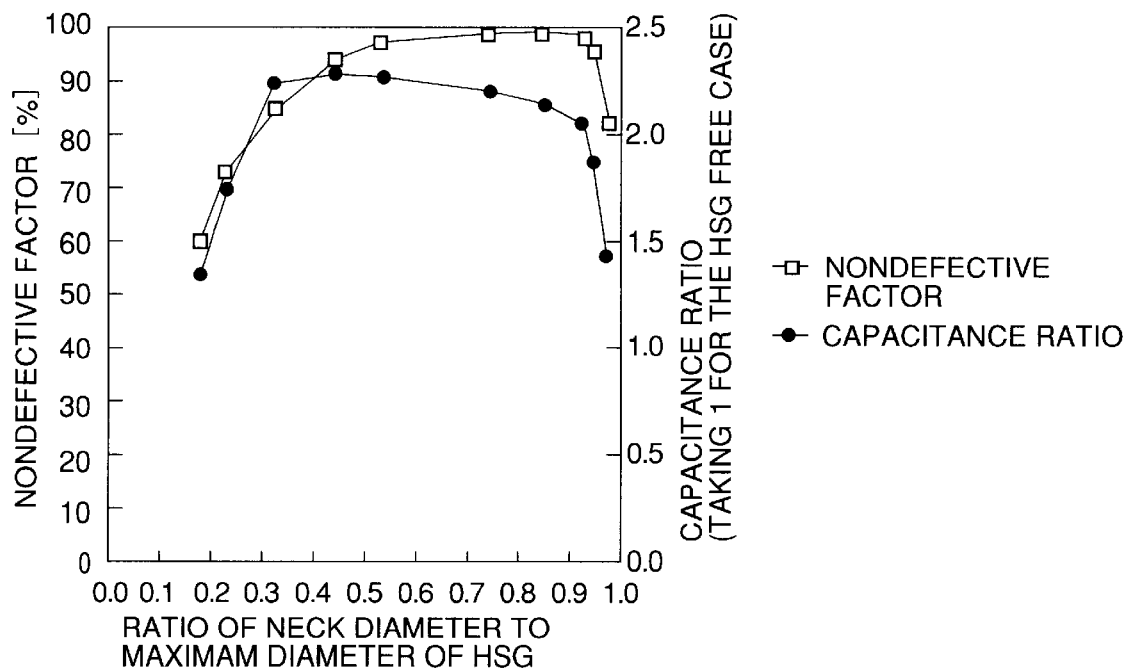
FIG. 9 is a graph showing the dependence of the nondefective factor and the capacitance ratio on the ratio of the diameter of the neck augmented by the silicon film formation to the maximum diameter of the HSG.

FIG. 9 shows the dependence of the nondefective factor and the capacitance ratio (assuming 1 for the case of no HSG processing for applied voltage of −1V) on the ratio of the neck diameter to the maximum diameter of the HSGs. The determination of the ratio of the neck diameter to the maximum HSG diameter was made by taking the photographs of sectional SEM of 50 HSG samples prepared by varying the thickness of the grown phosphorus doped silicon film after HSG processing to measure the ratio, and taking the average. The grain size and the neck diameter ratio of the HSG in the initial period (prior to the formation of the phosphorus doped silicon film) were set to be about 600 Å and about 0.2 (the neck diameter was set to be about 120 Å), respectively.

When the neck diameter ratio is less than about 0.3, the increase in the capacity is small due to occurrence of depletion, and reaches a maximum in the vicinity of the ratio of about 0.4. Decreasing gradually thereafter until the ratio of 0.9, and the capacity decreases rapidly beyond the ratio of 0.9 because of the connection of the grains and the filling of the recesses. The nondefective factor shows values of more than 95% in the range of 0.4 to 0.95 of the neck diameter ratio. The fall of the nondefective factor below the neck diameter ratio of 0.4 is caused by the fracture of the HSGs, giving rise to short-circuiting between the electrodes, which leads to the drop in the capacity due to depletion. The fall of the nondefective factor beyond the neck diameter ratio of 0.95 is considered to be caused by the loss of the surface area expansion effect due to the filling of the recesses, resulting in the drop of the capacity. Accordingly, it can be seen that a large capacity and a high nondefective factor can be obtained by setting the neck diameter augmented by the silicon film to be in the range of 0.4 to 0.95, more preferably 0.4 to 0.9, relative to the maximum diameter of the HSG.

In the conventional technique, when the neck diameter ratio is desired to be augmented, it is necessary to suppress the grain size of the HSGs to a small value, which hinders the increase in the capacity. Further, it has already been mentioned that the conventional technique has a drawback in that if the grain size is set to a sufficiently large value in order to obtain a large increase in the capacity, the neck diameter ratio becomes small on the contrary, making the HSGs liable to fracture. It is to be emphasized that this invention enables a relatively free control of the neck diameter even for HSGs with diameter of more than 500 Å which gives a large surface area increase.

In this invention, after the HSG growth, a silicon film is deposited preferably by an LP-CVD method to augment the neck diameter while maintaining the rugged shape of the HSGs. Even when neighboring HSGs are brought into contact and connected with each other, for example, by the formation of a deposited film by the LP-CVD, the film forming gas can enter the gaps between the HSGs, so that the neck diameter can be augmented as mentioned above.

The silicon film to be formed in this process may be either an undoped silicon film or an impurity doped silicon film. When an impurity doped silicon film is formed, the formed silicon film itself serves as a supply source of the impurity, increasing the dose of the impurity into the HSGs, so that it is desirable when the electrode is used for a capacitor because it further suppresses the depletion on the negative bias (namely, lower electrode) side.

Moreover, in this invention it is possible, after deposition of an undoped or doped silicon film on the HSGs, to introduce an impurity from the outside by subjecting the sample to a heat treatment in a POCl3 atmosphere. A phosphorus glass layer is formed by carrying out a heat treatment in a POCl3 atmosphere, but the subsequent processes need only be continued by removing the formed phosphorus glass layer with hydrofluoric acid. By the introduction of the impurity from the outside in this manner, it is possible to further suppress the depletion on the negative bias side.

Then, a dielectric film is formed on the HSGs with augmented neck diameter. Conventionally known materials can be used for the dielectric film. Thus, a dielectric film may be formed by depositing a silicon nitride film, for example, and then by oxidizing the surface in an oxidizing atmosphere. Such a dielectric film is formed to a thickness in the range of 45 to 60 Å, and more preferably, in the range of 48 to 50 Å in the equivalent of SiO2 film.

Next, an upper electrode of the capacitor is formed. The upper electrode may be formed of an impurity doped amorphous silicon film the same as in the lower electrode. The upper electrode may also be formed using a metal such as titanium nitride or tungsten nitride, and in such a case, tantalum oxide or the like may be used as the dielectric film.

The diffusion of the impurity into the HSGs takes place in each heat treatment step during the fabrication process. However, a separate thermal diffusion process may be provided. The thermal diffusion of the impurity is performed by heating at a temperature above 600° C., more preferably above 700° C. An optimum temperature for the thermal diffusion may be selected appropriately corresponding to the device characteristics.

In the following, specific examples will be described in detail strictly for the formation of semiconductor capacitors of this invention, but the application of this invention is not limited to these embodiments.

Embodiment 1

Figure 3:
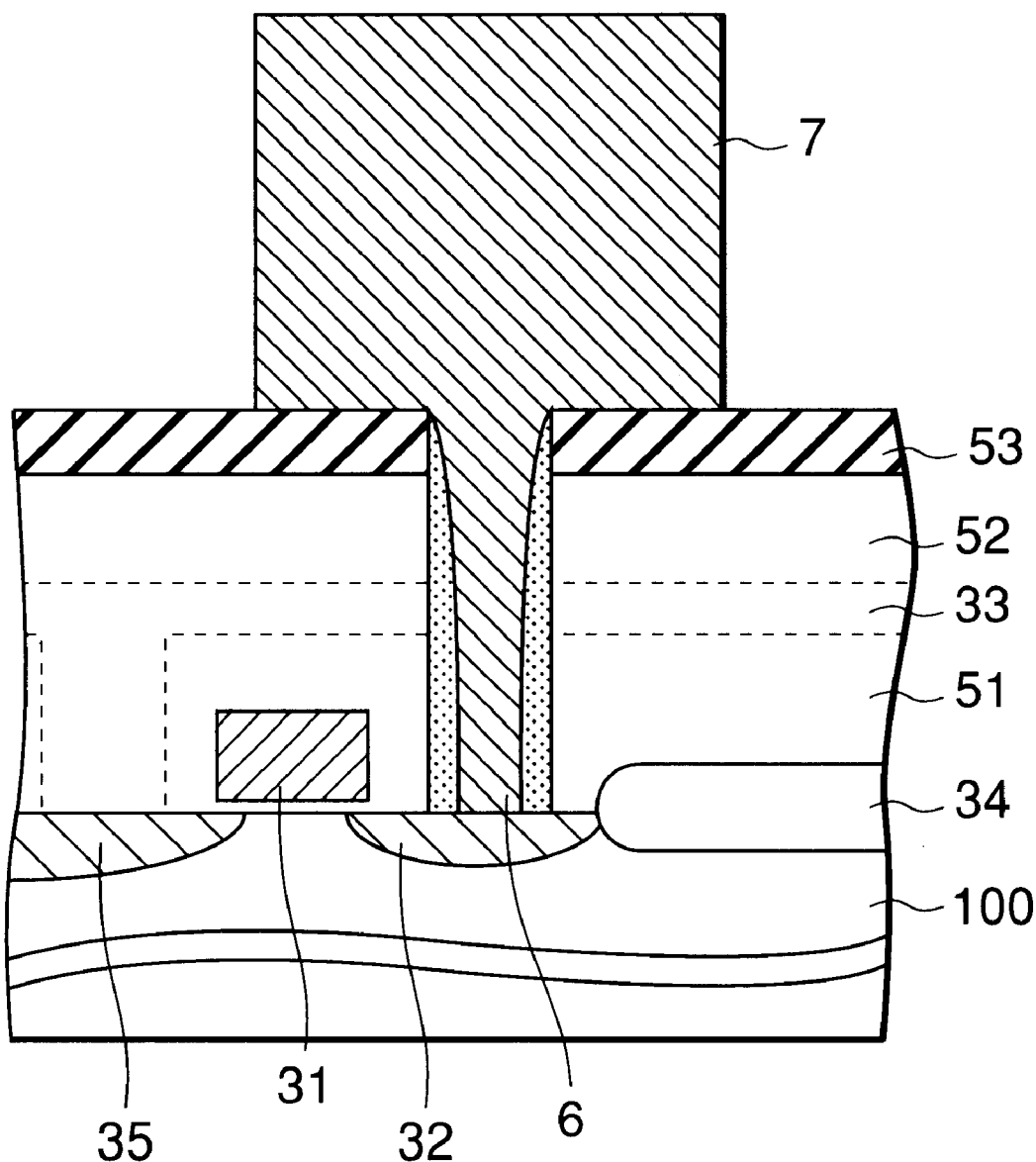
FIG. 3 is a diagram for explaining the formation process of a capacitor according to the invention, showing a schematic sectional view of the lower electrode part prior to the formation of the HSGs.

First as shown in FIG. 3, a transistor having a gate electrode 31, two diffusion region 32, 35 formed in a silicon substrate, and the transistor is isolated by an element isolation silicon oxide film (LOCOS) 34. One diffusion region 35 is connected to a bit line 33 formed on a layer insulating film 51, and the other diffusion region 32 to be connected to a capacitor via a contact hole 6 which is formed in the insulating film 51, an insulating film 52, and an insulating film 53. An insulating layer is formed on a side wall of the contact hole 6. Then an amorphous silicon film containing phosphorus as an impurity is formed on the insulating film 53 to contact with the diffusion layer 32.

Then, a lower electrode 7 is patterned in a desired shape by using known lithography technique and etching technique.

Next, after removing the natural oxide film and the like from the surface of the lower electrode, and the sample is irradiated with silane (with 20% of argon as the base) at a temperature of 550 to 570° C. under a pressure of about 1 mTorr to selectively form an undoped amorphous silicon film containing fine crystals on the surface of the lower electrode to a thickness of 100 to 150 Å. (In this stage, no growth of HSGs takes place. It is known that HSGs do not grow during the irradiation of silane.)

Figure 4:
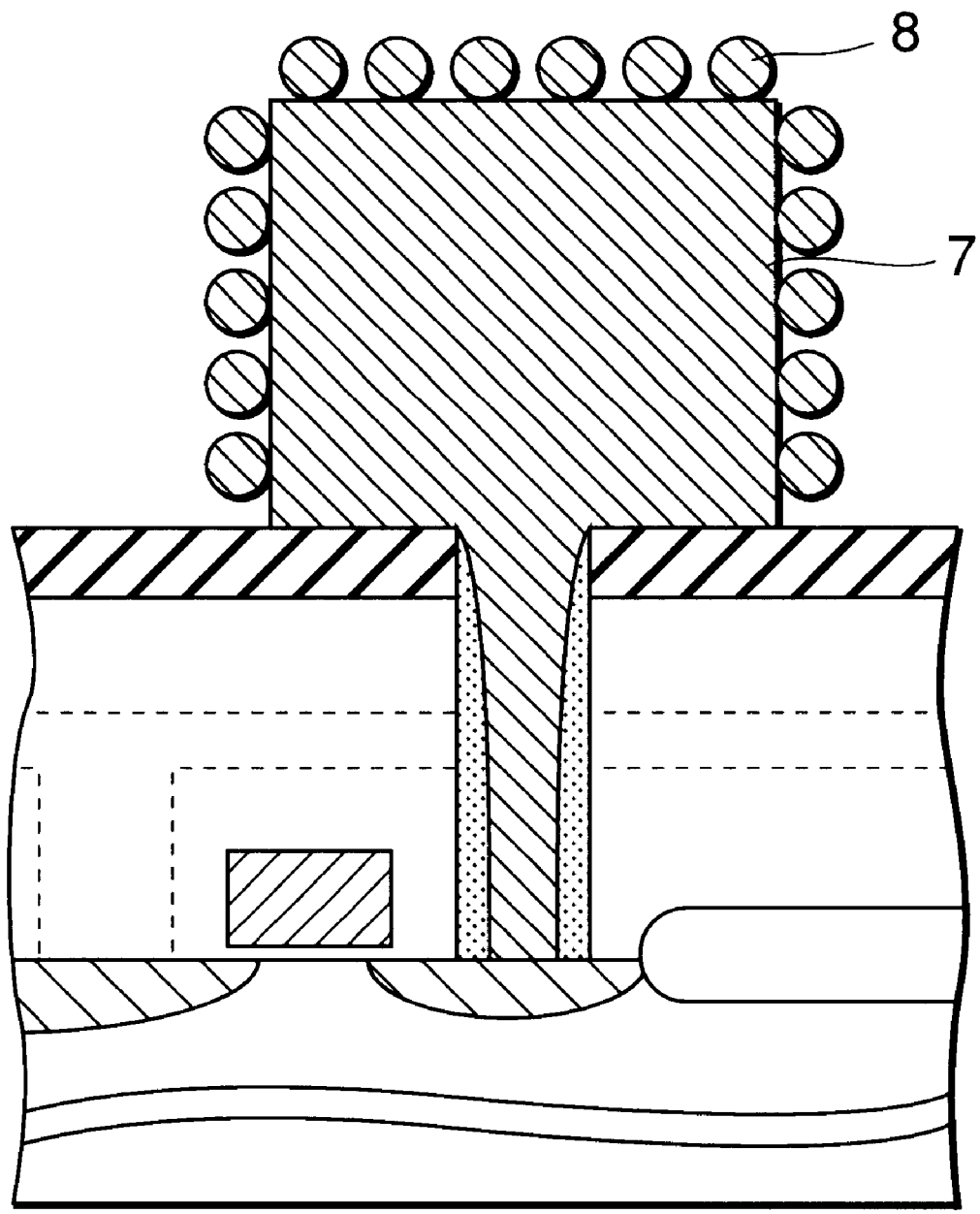
FIG. 4 is a schematic sectional view showing the state after the formation of HSGs on the lower electrode shown in FIG. 3.

Following that, the irradiation of silane is stopped, and HSGs 8 are grown to a diameter of 500 to 700 Å by annealing. The cross-section after the formation of the HSGs is shown schematically in FIG. 4. As shown in FIGS. 1 and 4, the grown HSGs (see label 2 in FIG. 1) and the underlying phosphorus doped amorphous silicon film (see label 1 in FIG. 1) are connected via thin "necks" 3 of about 80 Å diameter. Gaps of 50 to 80 Å exist between the "necks" and the underlying amorphous silicon film.

Next, a silicon film 4 is selectively formed to a thickness of about 50 Å on the surface of the lower electrode with formed HSGs by the irradiation of silane for a second time. The condition of a single HSG at this time is shown schematically in FIG. 1. Observation of the cross-section by an SEM reveals that the gap between the "neck" 3 of the HSG and the underlying amorphous silicon film 1 is filled with the silicon film 4, augmenting the neck diameter to about 500 Å as shown in FIG. 1.

Figure 5:
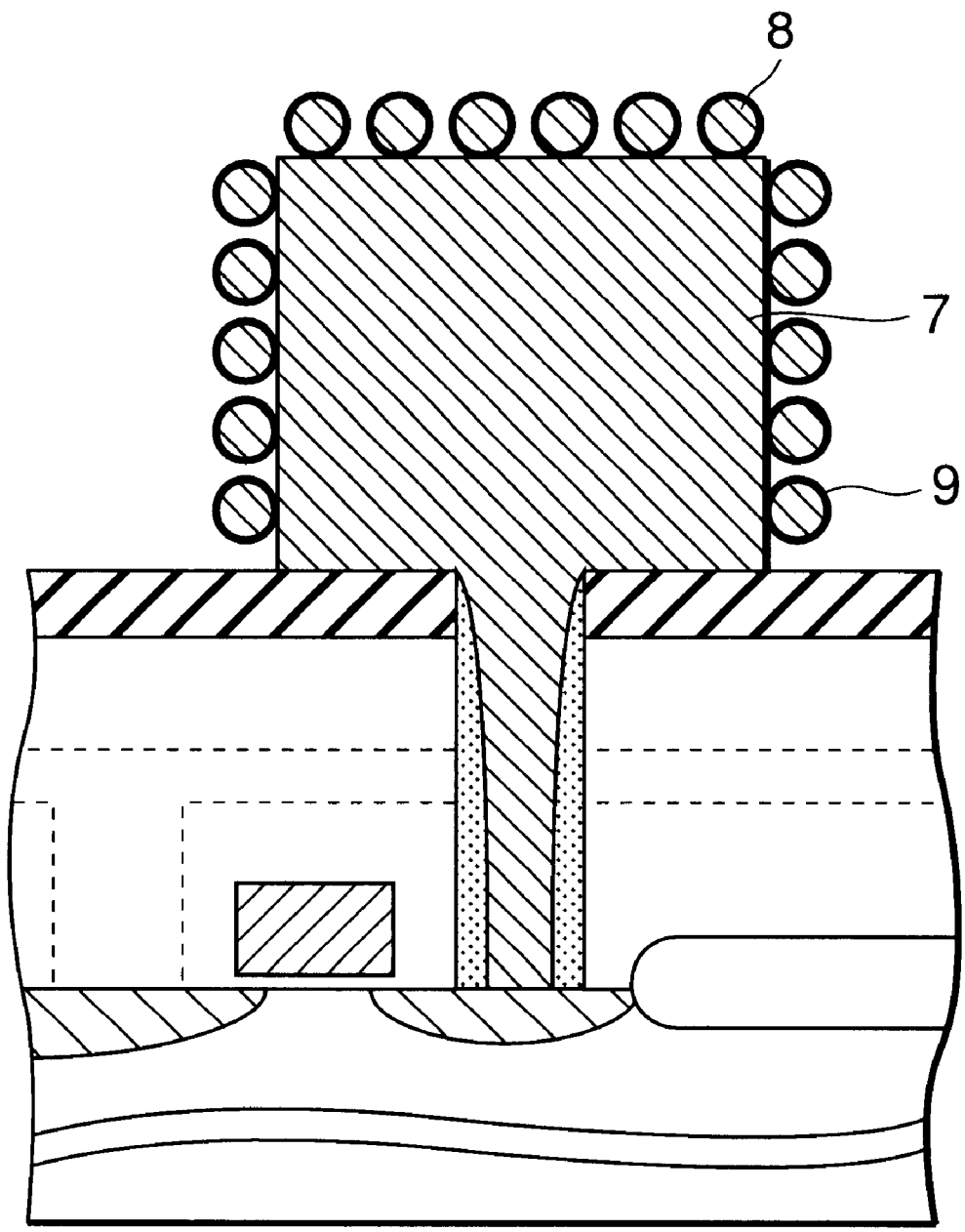
FIG. 5 is a schematic sectional view showing the state of formation of a dielectric film on the capacitor with HSGs shown in FIG. 4.

Next, as shown in FIG. 5, a silicon nitride film 9 of 60 Å is formed at 700° C. as a dielectric film by a known LP-CVD method.

Following that, a part of the surface of the silicon nitride film is converted to an oxide film by performing a pyrogenic oxidation at 800° C. for 30 minutes (not shown).

Figure 6:
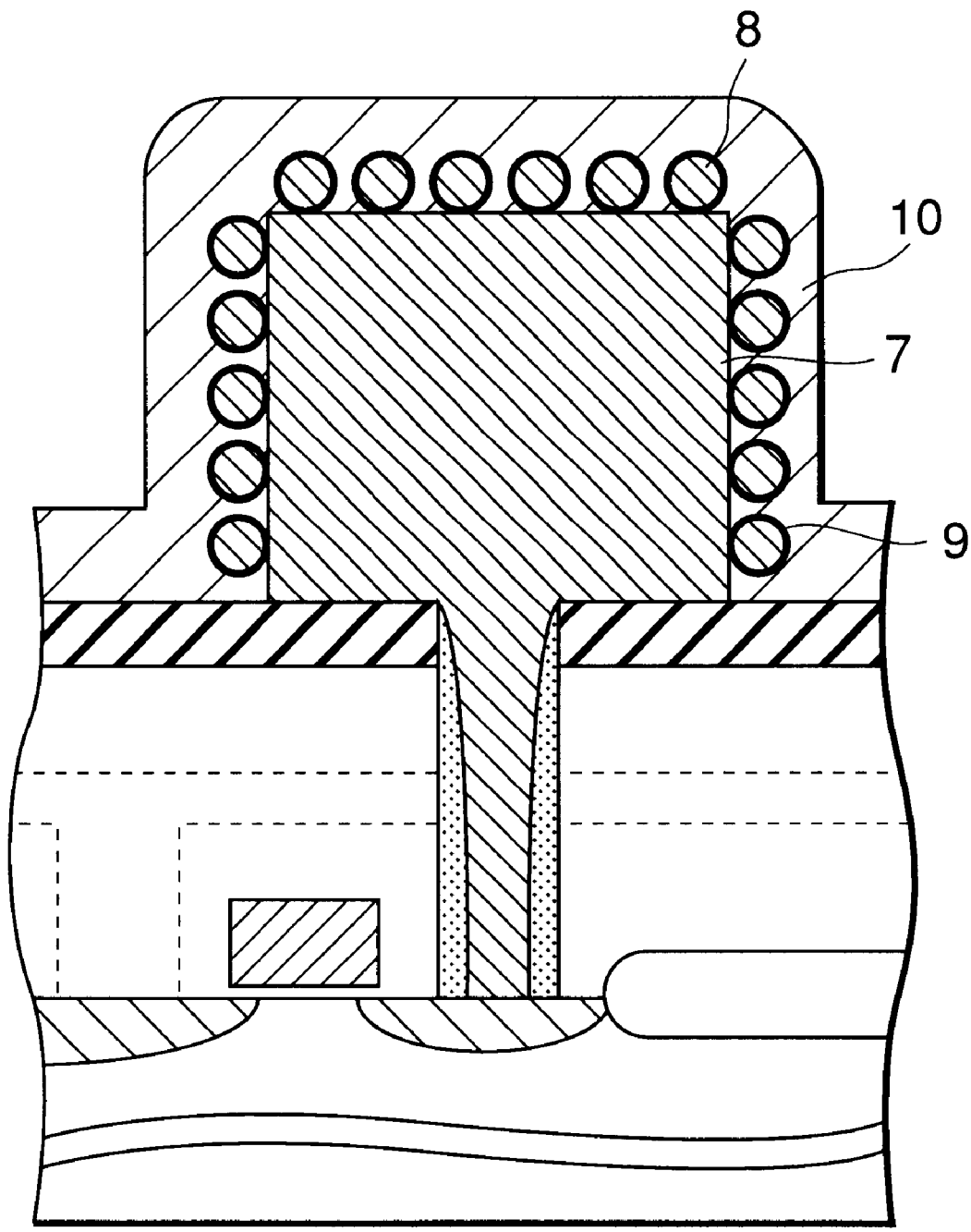
FIG. 6 is a schematic sectional view showing the state of formation of an upper electrode on the constitution in FIG. 5.

Next, as shown in FIG. 6, an upper electrode 10 is obtained by forming a silicon film containing $3 \times 10^{20}$ atoms/cc of phosphorus as an impurity by a known LP-CVD method.

Figure 7:
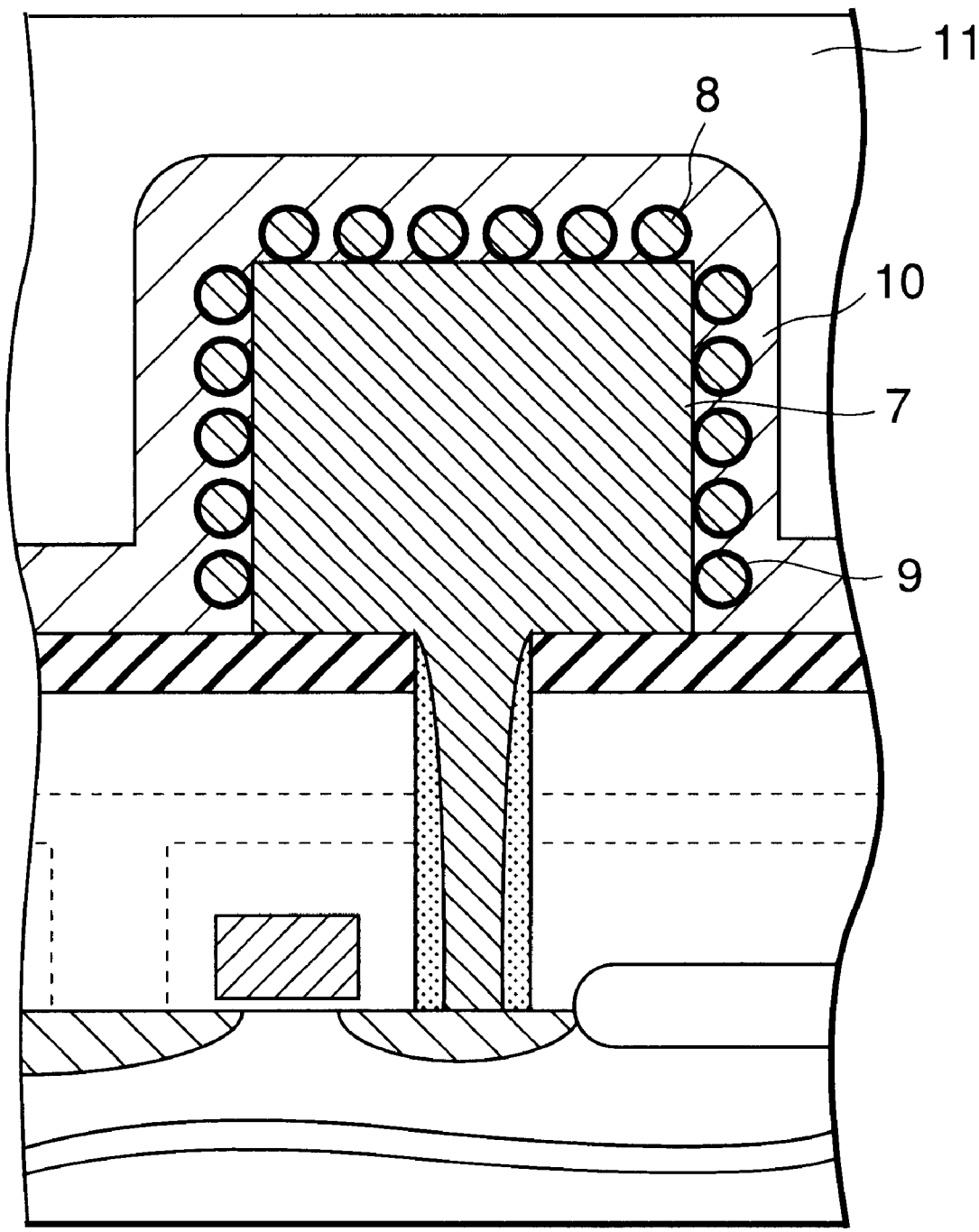
FIG. 7 is a schematic sectional view showing the state of formation of a layer insulating film on the constitution in FIG. 6.

Then, a layer insulating film (BPSG film) 11 is deposited, and the impurity is activated by subjecting it to a heat treatment at 800° C. for 10 minutes (FIG. 7).

Figure 8:
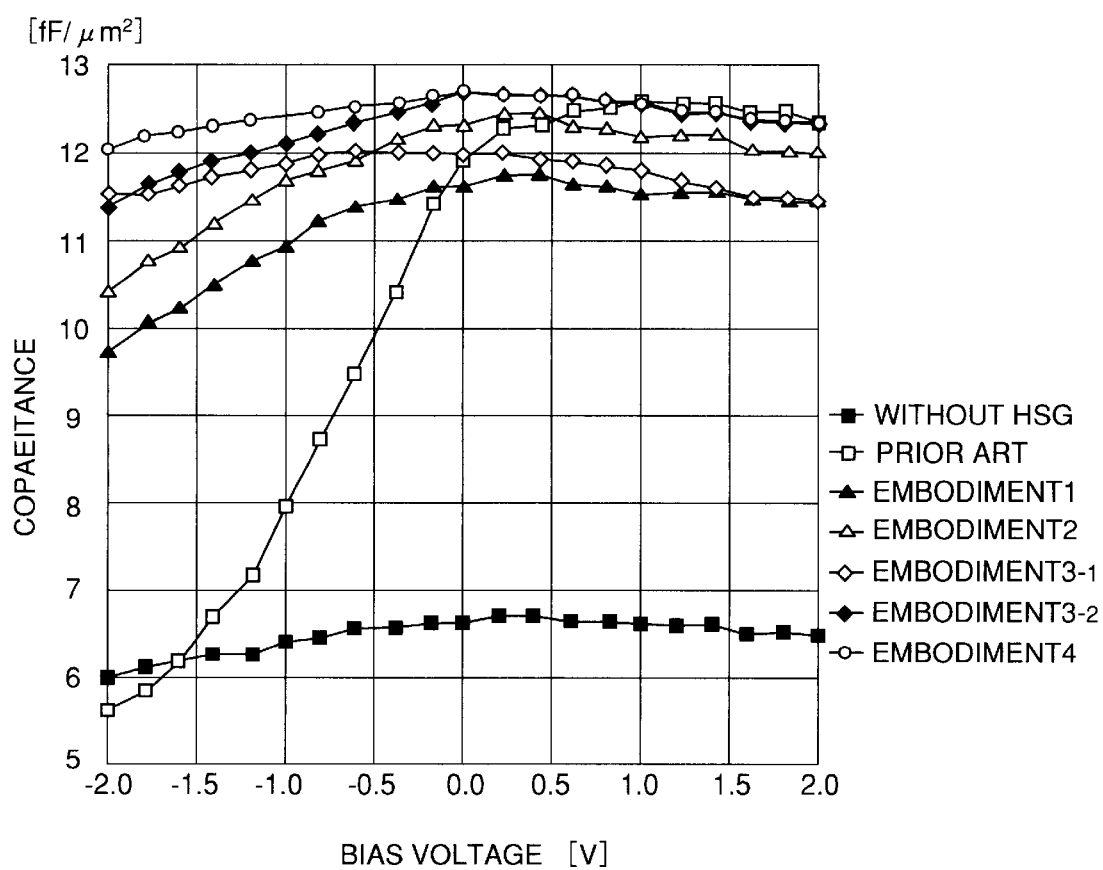
FIG. 8 is a graph showing the C-V characteristic of capacitors formed by various embodiments and examples.

The C-V characteristic of the capacitor thus formed is shown in FIG. 8. In addition, the C-V characteristic of a capacitor (prior art) obtained without the formation of the silicon film 4, and of a capacitor lacking the HSGs are shown in FIG. 8 as a comparative example and a reference, respectively.

Although the maximum values Cs of the capacity of some embodiments of this invention are inferior to some extent to that of the comparative example, in the vicinity of the bias voltage of actual use, −1.2V, the capacities of this invention are higher on the contrary.

Immediately after the formation of HSG silicon, no impurity is contained in it, so that it is necessary to introduce an impurity into it in one way or another in order to make it function as an electrode.

In the comparative example, the impurity has to be introduced by thermal diffusion from the underlying layer into the HSG bodies through the narrow "necks" 3 of about 80 Å diameter, and the narrowness of the "necks" 3 was the "bottle-neck" of the problem.

In this invention, introduction of the impurity into the HSGs is facilitated than in the comparative example by augmenting the diameter of the "necks" 3. Further, in the comparative example, cases arose in which the HSGs suffered from fracture during the cleaning process or the like because of the small diameter of the "necks" 3, and the fractions of the HSGs became the cause of short circuiting between the electrodes, deteriorating the yield. In this invention, however, the "necks" are reinforced so that the resistance to mechanical fracture is improved in addition.

Embodiment 2

In embodiment 1, there was a disadvantage that the maximum value of Cs is somewhat inferior to that of the comparative example. This is considered due to reduction in the surface area caused by partial filling of the recesses by the film formation on the HSGs. With this in mind, after the selective growth of the silicon film on the HSGs the silicon film is etched by about 30 Å using mixed aqueous solution of ammonia and hydrogen peroxide at 60° C.

Figure 2:
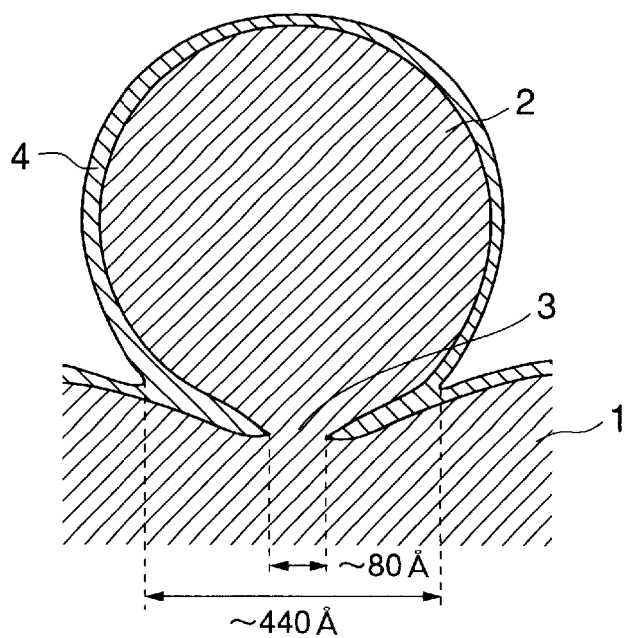
FIG. 2 is an enlarged sectional view of the HSG portion according to another embodiment of the invention.

Since this etching takes place isotropically, the silicon film 2 filling the spaces between the "necks" 3 and the underlying silicon 1 remain, and it was found that the "neck" diameter once increased is reduced to about 440 Å. The situation is illustrated in FIG. 2.

Thereafter, a capacitor is formed in the same way as in embodiment 1, and the C-V characteristic of the capacitor thus formed is shown in FIG. 8.

Since the reduction in the neck diameter is small relative to the recovery of the surface area, it can be seen that the maximum value of Cs is also improved than in embodiment 1.

Embodiment 3

In embodiments 1 and 2, an undoped silicon film is formed on the HSGs. In this embodiment, a phosphorus-doped silicon film instead of the undoped silicon film is formed on the HSGs for the purpose of introducing the impurity through the HSGs. The phosphorus-doped silicon film is selectively formed from a gaseous system containing phosphine (PH3) and silane under a pressure of about 1 mTorr and a temperature of 530 to 570° C. In the film formation, PH3 is introduced first, then silane is introduced to obtain a concentration of 3E20 atoms/cc, and a film of about 50 Å thickness is formed.

Thereafter a capacitor is formed in the same way as in embodiment 1. The C-V characteristic of the capacitor thus formed is shown in FIG. 8 (embodiment 3-1).

In addition, the C-V characteristic of a capacitor formed by isotropically etching the phosphorus-doped silicon film by about 10 Å, in the same way as in embodiment 2 is also shown in FIG. 8 (embodiment 3-2)

It can be seen that the depletion on the negative (lower electrode) side is further suppressed in comparison with embodiments 1 and 2.

Embodiment 4

The case of thermally diffusing phosphorus into the HSGs from the outside by forming an undoped or a phosphorus-doped silicon film on the HSGs, then further subjecting the sample to a heat treatment in a POCl3 atmosphere will be described.

For example, after forming HSGs in the same way as in embodiment 1, an undoped silicon film is deposited to about 100 Å on the HSGs. Then, a heat treatment in a POCl3 atmosphere of 800° C. for 5 minutes produced a phosphorus glass layer of about 120 Å thickness. After that the formed phosphorus glass layer is removed by hydrofluoric acid, and a capacitor is obtained by forming a dielectric film and an upper electrode in the same way as in embodiment 1.

The C-V characteristic of the capacitor thus formed is shown in FIG. 8 (embodiment 4). It can be seen that depletion on the negative side is further suppressed.

When phosphorus is diffused employing the conventional method without augmenting the neck diameter of the HSGs, part or the entirety of the HSGs is converted to phosphorus glass layer, and some of the HSGs fell off the lower electrode in the removal process of the phosphorus glass layer with hydrofluoric acid, resulting in no increase in the capacity. In addition, the fallen HSGs caused short-circuiting of the lower electrode, and degraded the yield conspicuously.

According to this invention, it is possible to introduce a sufficient amount of the impurity into the HSGs by augmenting the diameter of the necks, prevent depletion, and secure the necessary capacitance of the capacitor.

Although the invention has been described with reference to specific embodiments, this description is not meant to be construed in a limited sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device comprising:
   an electrode having a first silicon layer, a plurality of spherical silicon grains formed on said first silicon layer, and a second silicon layer formed on said plurality of silicon grains and one said first silicon layer,
   wherein said second silicon layer is formed directly on said plurality of silicon grains and directly on said first silicon layer.

2. The semiconductor device as claimed in claim 1, wherein each of said plurality of silicon grains has a first neck having a first diameter at a boundary between said first silicon layer and said silicon grains,
   wherein each of said plurality of silicon grains is covered with said second silicon layer having a second neck with a second diameter at a boundary between said first silicon layer and said silicon grains covered with said second silicon layer, and
   wherein said second diameter is smaller than a third diameter that corresponds to a maximum diameter of said silicon grains covered with said second silicon layer.

3. The semiconductor device as claimed in claim 2, wherein said second diameter is larger than said first diameter.

4. The semiconductor device as claimed in claim 1, wherein said first silicon layer is made of a silicon containing an impurity.

5. The semiconductor device as claimed in claim 1, further comprising:
   a dielectric film formed on said electrode; and
   a conductive film formed on said dielectric film.

6. The semiconductor device as claimed in claim 5, wherein said semiconductor device is a capacitor.

7. A semiconductor device comprising:

an electrode having a first silicon layer, at least one spherical silicon grain formed on said first silicon layer, and a second silicon layer formed on a circumferential surface of said at least one spherical silicon grain and on said first silicon layer, wherein a bottom portion of said at least one spherical silicon grain is formed on a portion of said first silicon layer so as to form a neck region, the neck region being a region where said at least one spherical silicon grain contacts said first silicon layer, wherein a first portion of said second silicon layer covers both a first portion of said first silicon layer and a first portion of said circumferential surface of said at least one spherical silicon grain, and wherein one side of said neck is strengthened by said first portion so as to provide an enhanced neck structure for said semiconductor device.

8. The semiconductor device as claimed in claim 7, wherein a second portion of said second silicon layer covers both a second portion of said first silicon layer and a second portion of said circumferential surface of said at least one spherical silicon grain, wherein another side of said neck opposite said one side of said neck is strengthened by said second portion so as to further provide the enhanced neck structure for said semiconductor device.

9. The semiconductor device as claimed in claim 7, wherein a second neck is formed when the second layer is formed on said at least one spherical silicon grain and on said first silicon layer, wherein a first diameter corresponds to a diameter of said neck, wherein a second diameter corresponds to a diameter of said second neck, and wherein said second diameter is greater than said first diameter.

10. The semiconductor device as claimed in claim 9, wherein a third diameter corresponds to a maximum diameter of said spherical silicon grain covered with said second silicon layer, and wherein said third diameter is greater than said second diameter.

11. The semiconductor device as claimed in claim 7, wherein said first silicon layer is made of a silicon containing an impurity.

12. The semiconductor device as claimed in claim 7, further comprising:

a dielectric film formed on said electrode; and a conductive film formed on said dielectric film.

13. The semiconductor device as claimed in claim 6, wherein said semiconductor device is a capacitor.

14. The semiconductor device as claimed in claim 12, wherein the dielectric film is a silicon nitride film.

15. The semiconductor device as claimed in claim 14, wherein a part of the silicon nitride film is converted to an oxide film.

16. The semiconductor device as claimed in claim 15, wherein the conductive film is a phosphorous-containing silicon film.

17. The semiconductor device as claimed in claim 7, wherein said second silicon layer is formed directly on said plurality of silicon grains and directly on said first silicon layer.

18. A semiconductor device comprising:

an electrode having a first silicon layer, at least one spherical silicon grain formed on said first silicon layer, and a second silicon layer formed on a circumferential surface of said at least one spherical silicon grain and on said first silicon layer, wherein a bottom portion of said at least one spherical silicon grain is formed on a portion of said first silicon layer so as to form a neck region, the neck region being a region where said at least one spherical silicon grain contacts said first silicon layer, wherein a first portion of said second silicon layer covers both a first portion of said first silicon layer and a first portion of said circumferential surface of said at least one spherical silicon grain, wherein one side of said neck is strengthened by said first portion so as to provide an enhanced neck structure for said semiconductor device, wherein a second portion of said second silicon layer covers both a second portion of said first silicon layer and a second portion of said circumferential surface of said at least one spherical silicon grain, wherein another side of said neck opposite said one side of said neck is strengthened by said second portion so as to further provide the enhanced neck structure for said semiconductor device, and wherein said second silicon layer is formed directly on said plurality of silicon grains and directly on said first silicon layer.

19. The semiconductor device as claimed in claim 12, wherein the conductive film is a phosphorous-containing silicon film.

* * * * *